US006756163B2

(12) United States Patent
Yan

(10) Patent No.: US 6,756,163 B2
(45) Date of Patent: Jun. 29, 2004

(54) RE-USABLE EXTREME ULTRAVIOLET LITHOGRAPHY MULTILAYER MASK BLANK

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 10/186,053

(22) Filed: Jun. 27, 2002

(65) Prior Publication Data

US 2004/0002009 A1 Jan. 1, 2004

(51) Int. Cl.$^7$ ................................................. G03F 9/00
(52) U.S. Cl. ............................................................ 430/5
(58) Field of Search ........................... 430/5; 359/360, 359/361; 378/35

(56) References Cited

U.S. PATENT DOCUMENTS 6,656,643 B2 * 12/2003 Gupta et al. .................... 430/5

OTHER PUBLICATIONS

John E. Bjorkholm, EUV Lithography–The Successor to Optical Lithography?, 8 pages, Intel Corp., Santa Clara.
Michael Lercel, et al., Examining the Challenges Posed by NGL Photomask Fabrication, MicroMagazine.com, 2001, 12 pages.
Rajendra Aithal, EUV Lithography: Competitor for the Next Generation Lithography, Dept. of Electrical Engineering, Institute for Micromanufacturing.
Dr. Lutz Aschke, Fit for Future—Chip Technology, 99/2001, Schott Info, 3 pages.
EUVL Mask Blank Defect Inspection, 2 pages http://www–mask.lbl.gov/Pages/masks.html.
Linus Fetter, et al.,Patterning of Membrane Masks for Projection e–Beam Lithography, Bell Laboratories, Lucent Technologies, NJ.
Peter J. Silverman, The Intel Lithography Roadmap, Intel Technology Journal, May 2002, pp. 55–61, vol. 6, Issue 02, Intel Corp.
Intel, Intel Delivers Photomask for EUV Lithography, Mar. 2001, Intel Labs.
Charles W. Gwynn, Extreme Ultraviolet Lithography for Next Generation IC's, Oct. 2000, MDR Forum.

* cited by examiner

*Primary Examiner*—S. Rosasco
(74) *Attorney, Agent, or Firm*—Blakely, Sokoloff, Taylor & Zafman LLP

(57) ABSTRACT

An embodiment of the present invention includes an outer capping layer, a multilayer (ML) stack, and an inner capping layer. The outer capping layer is made of an outer material and has an outer thickness. The multilayer (ML) stack is below the outer capping layer. The inner capping layer is made of an inner material and has an inner thickness and is located between the ML stack and a ML reflector. The inner thickness is selected to enable constructive interference between the ML stack and the ML reflector.

30 Claims, 7 Drawing Sheets

RE-USABLE EXTREME ULTRAVIOLET LITHOGRAPHY MULTILAYER MASK BLANK

BACKGROUND

1. Field

Embodiments of the invention relate to the field of semiconductor, and more specifically, to lithography.

2. Background

Extreme ultraviolet lithography (EUVL) is a new generation lithography that uses extreme ultraviolet (EUV) radiation with a wavelength in the range of 10 to 14 nanometer (nm) to carry out projection imaging. The EUVL system uses reflective optics and masks in which the image is formed in an absorbing metal.

EUVL masks are patterned from multilayer (ML) mask blanks. To achieve the highest image quality, mask blanks must be manufactured without defects. Due to high degree of accuracy requirements, these ML mask blanks are expensive. Current techniques to fabricate ML mask blanks are for one-time use only. After the mask blank is used for mask patterning, it is usually discarded. Reclaiming the ML blanks with the current design is impossible without sacrificing the quality of the mask.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention includes an outer capping layer, a multilayer (ML) stack, and an inner capping layer. The outer capping layer is made of an outer material and has an outer thickness. The multilayer (ML) stack is below the outer capping layer. The inner capping layer is made of an inner material and has an inner thickness and is located between the ML stack and a ML reflector. The inner capping layer and the ML stack form N pairs. N is a positive integer. The inner thickness is selected to enable constructive interference between the ML stack and the ML reflector.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, a sequence of operations, a sequence of fabrication phases, or a block diagram. Although a sequence of operations may describe the operations as a sequential process, many of the operations can be performed in parallel or concurrently. In addition, the order of the operations may be re-arranged. A process is terminated when its operations are completed. A process may correspond to a method, a program, a procedure, etc.

Figure 1:
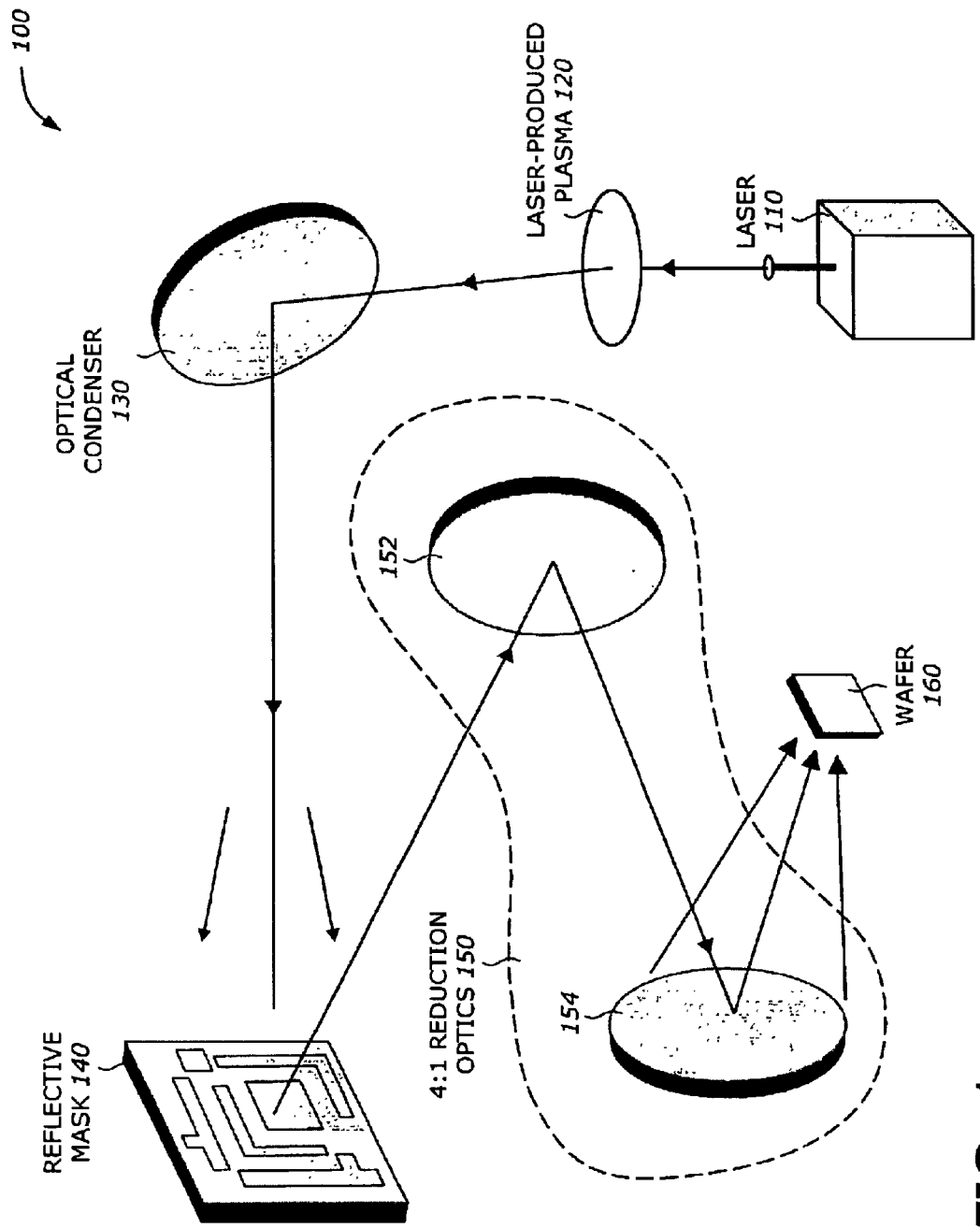
FIG. 1 is a diagram illustrating a system in which one embodiment of the invention can be practiced.

FIG. 1 is a diagram illustrating a system 100 in which one embodiment of the invention can be practiced. The system 100 includes a laser 110, a laser-produced plasma 120, an optical condenser 130, a reflective mask 140, a reduction optics 150, and a wafer 160.

The laser 110 generates a laser beam to bombard a target material. This produce the plasma 120 with a significant broadband extreme ultra-violet (EUV) radiation. The optical condenser 130 collects the EUV radiation through a number of mirrors coated with EUV interference films. The optical condenser 130 then illuminates the reflective mask 140 with EUV radiation at 13 nm wavelength.

The reflective mask 140 has an absorber pattern across its surface. The pattern is imaged at 4:1 demagnification by the reduction optics 150. The reduction optics 150 includes a number of mirrors such as mirrors 152 and 154. These mirrors are aspherical with tight surface figures and roughness (e.g., less than 3 Angstroms). The wafer 160 is resist-coated and is imaged by the pattern on the reflective mask 140. Typically, a step-and-scan exposure is performed, i.e., the reflective mask 140 and the wafer 160 are synchronously scanned. Using this technique, a resolution less than 50 nm is possible.

The reflective mask 140 has a re-usable mask blank which can be reclaimed after a first use. Since construction of the reflective mask is expensive, discarding a used mask is wasteful. The technique described in this invention allows a mask blank to be re-used after a first use. In theory, a reclaim of more than the second use may be possible depending on the damage level of the first and subsequent uses. The design may be repeated with similar construction for subsequent uses. Note that the diagrams shown in the figures are for illustrative purposes only. The dimensions are not scaled.

Figure 2:
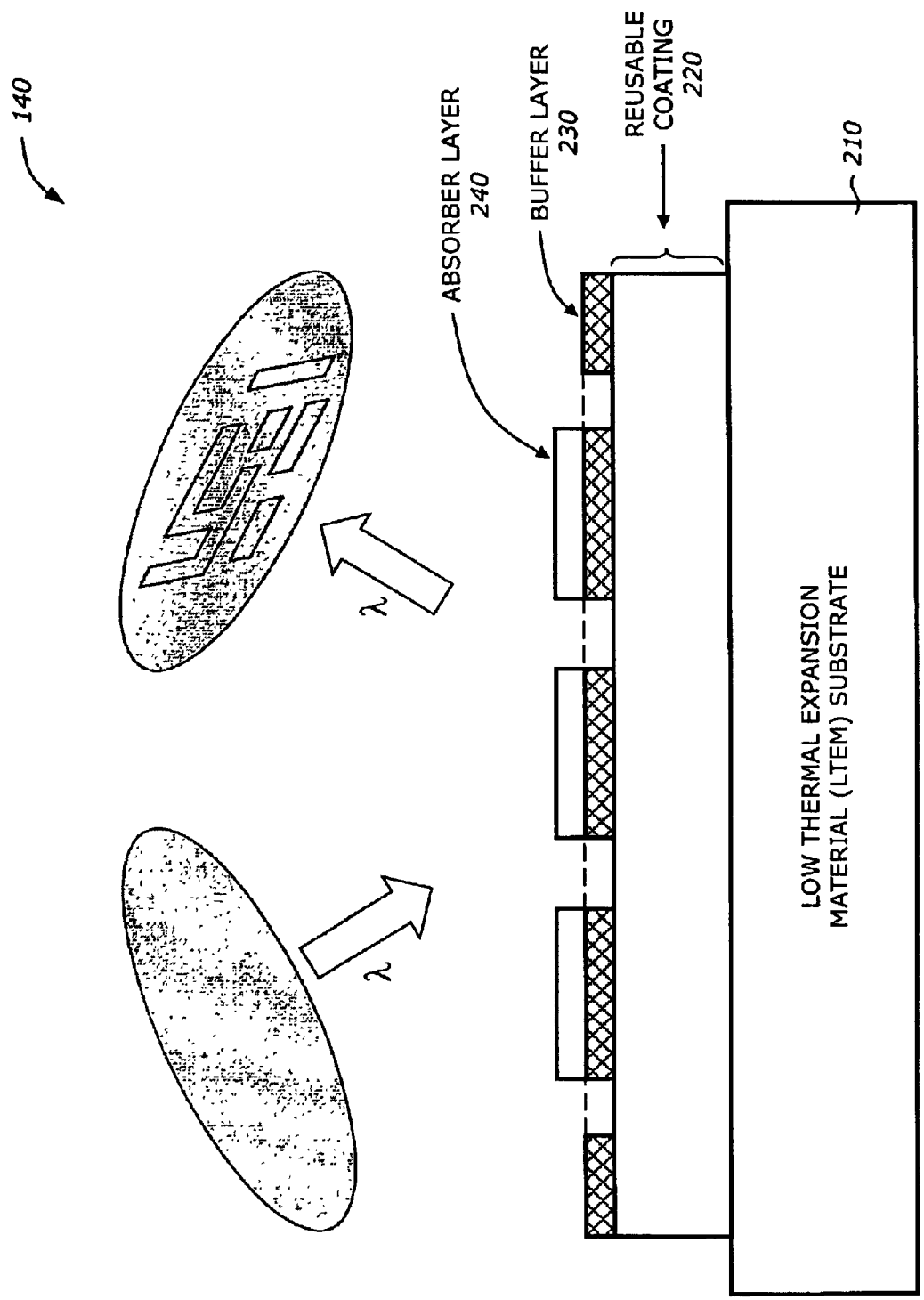
FIG. 2 is a diagram illustrating a reflective mask according to one embodiment of the invention.

FIG. 2 is a diagram illustrating the reflective mask 140 according to one embodiment of the invention. The reflective mask 140 includes a substrate 210, a re-usable coating 220, a buffer layer 230, and an absorber layer 240.

The substrate 210 is made of a material that has a low coefficient of thermal expansion (CTE). A low CTE provides stability against temperature changes. A typical CTE is +/−30 parts per billion (ppb)/° C. over a temperature range of 5° C. to 35° C. Other properties of the substrate 210 includes stability against crystallization, thermal cycling, and mechanical cycling. In one embodiment, the substrate material is ULE (ultra low expansion) glass manufactured by Corning Incorporated.

The re-usable coating 220 provides high reflectivity for the image projection. The re-usable coating 220 may be re-used after a first use. The re-usable coating 220 will be described in more detail in FIG. 3.

The buffer layer 230 facilitates the etching and repair of the absorber layer 240. It is usually a buried silicon oxide and has a thickness of approximately 20 nm to 100 nm. The absorber layer 240 allows a pattern to be formed through lithography.

Figure 3:
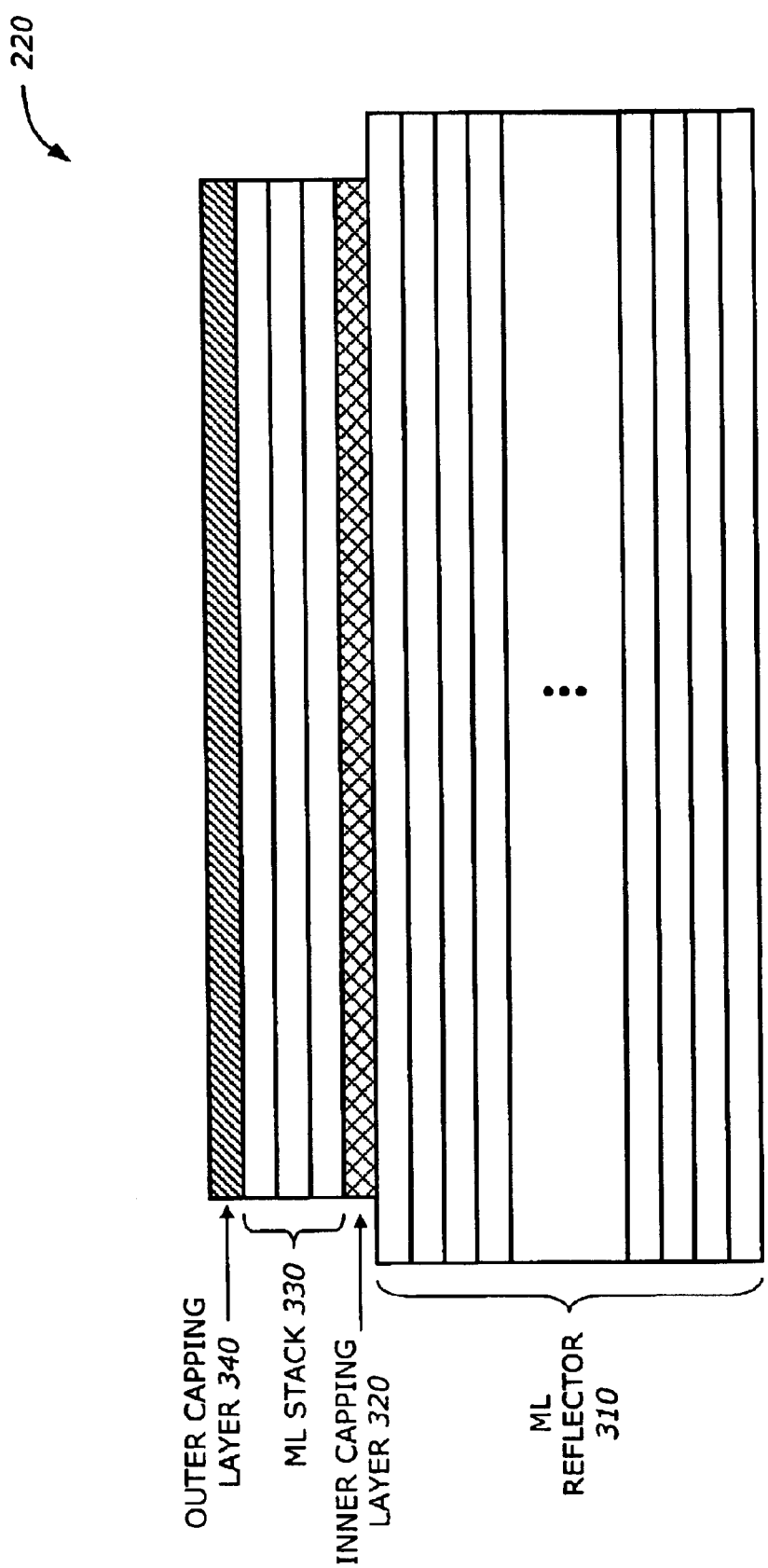
FIG. 3 is a diagram illustrating a reusable coating according to one embodiment of the invention.

FIG. 3 is a diagram illustrating a re-usable coating 220 according to one embodiment of the invention. The re-usable coating includes a multilayer (ML) reflector 310, an inner capping layer 320, a ML stack 330, and an outer capping layer 340.

The ML reflector 310 provides high reflectivity for the imaging process. It consists of a large number of alternating layers of materials having dissimilar optical constants for EUV radiation. These alternating layers provide a resonant reflectivity when the period of the layers is approximately $\lambda/2$. For $\lambda=13$ nm, a period of 6.5 nm is used. In one embodiment, the ML reflector 310 is made of 40 pairs of alternating layers of Molybdenum (Mo) and Silicon (Si).

The inner capping layer (ICL) 320 provides protection for the ML reflector 310. The ICL 320 is typically made of a relatively chemically inert material. The difference between the refractive indices of the material for the inner capping layer 320 and the adjacent layer is typically high. In one embodiment, the material is one of gold (Au), baron nitride (BN), carbon (C), palladium (Pd), platinum (Pt), rhodium (Rh), ruthenium (Ru), silicon (Si), silicon carbide (SiC), boron carbide ($B_4C$), silicon oxide ($SiO_2$), and titanium nitride (TiN). Other potential materials may include transition-metal borides, carbides and nitrides, boron carbide and alumina. The thickness h, of the inner capping layer 320 is selected to enable the constructive interference between the ML stack 330 and the ML reflector 310. The ICL 320 may also include more than one inner layer to provide more protection to the ML reflector during blank reclaiming and mask patterning.

The ML stack 330 includes a thin stack of alternating layers of different materials. Typical materials for the alternating layers are Mo and Si. Other materials may include any one of gold (Au), baron nitride (BN), carbon (C), palladium (Pd), platinum (Pt), rhodium (Rh), ruthenium (Ru), silicon (Si), silicon carbide (SiC), boron carbide ($B_4C$), silicon oxide ($SiO_2$), and titanium nitride (TiN). The ML stack 330 and the ML reflector 310 may form constructive, or additive, interference or destructive, or subtractive, interference. To optimize or improve the overall reflectivity for the first and subsequent uses, the thickness h, of the inner capping layer 320 is selected to enable, improve, optimize, or maximize this constructive interference. Through extensive simulations, this thickness may be obtained for a variety of configurations of the ML stack and other parameters. Typically, the construction of the ML stack 330 is the same as that of the ML reflector 310; i.e., the ML stack 330 forms constructive interference of scattered radiation. If the same two materials (e.g., Mo and Si) used in the ML reflector 310 are also used in the ML stack 330, then the bi-layer period and the ratio of one material thickness to the bi-layer period in the ML stack 330 is approximately the same to that of ML reflector 310. When different materials are used in the ML stack 330, the period and the ratio are adjusted depending upon the indices of refraction of the materials. The key is that a constructive interference of the scattered radiation is formed by the ML stack 330.

The inner capping layer 320 and the ML stack 330 form N pairs of layers where N is a positive integer. The value of N and the thickness of the alternating layers in the ML stack 330 are selected according to the damage level incurred after the first use of the reflective mask 140. The damage level may be a function of the mask process, cleaning, and usage and varies from cases to cases. Typically, N is between one to four.

The outer capping layer 340 provides protection for the ML stack 330. It is also made of material similar to the inner capping layer 320. However, the material and thickness of the outer capping layer 340 may not necessarily be the same as those of the inner capping layer 320.

The re-usable coating 220 is designed for more than one time use. In the first use, the re-usable coating 220 is used with the inner capping layer 320, the ML stack 330, and the outer capping layer 340. After the mask is used, the outer capping layer 340 and the ML stack 330 are etched and cleaned away, leaving the inner coating layer 320 and the ML reflector 310 intact to be used as a mask blank again. Several embodiments are possible to provide improved reflectivity for first use and subsequent use of the mask blank. Let $R_1$ and $R_2$ be the reflectivities of the mask blank at the first use and the second use, respectively. In the embodiments described below, the re-usable coating 220 will be labeled 401, 402, and 403. It is shown that the construction of the embodiments is such that $R_1$ and $R_2$ are approximately the same, indicating that the second use is almost as good as the first use.

Figure 4A:
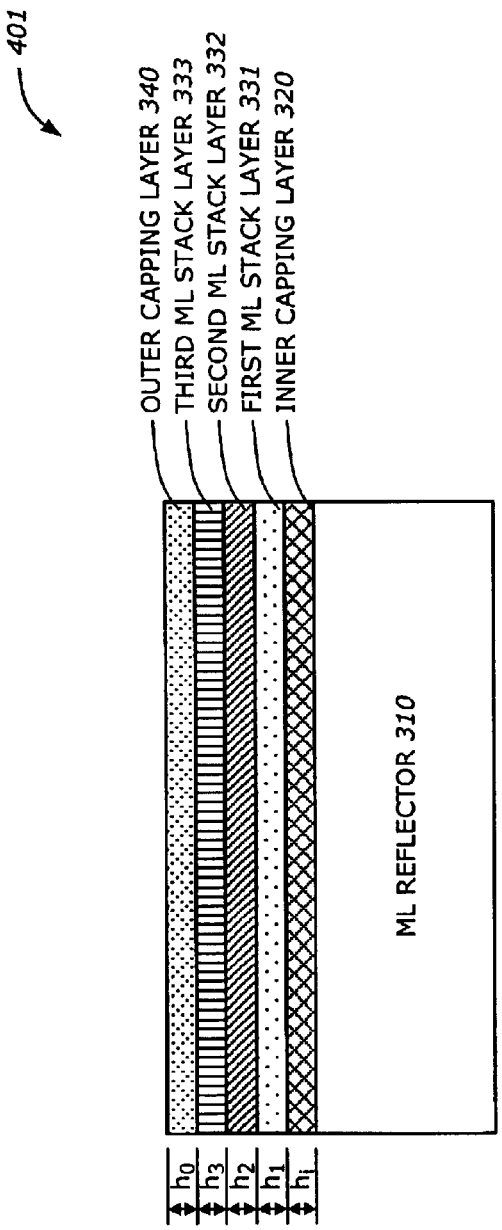
FIG. 4A is a diagram illustrating a reusable coating having three alternating layers in the ML stack according to one embodiment of the invention.

FIG. 4A is a diagram illustrating a reusable coating 401 having three alternating layers in the ML stack according to one embodiment of the invention. The re-usable coating 401 has the inner capping layer (ICL) 320, a first ML stack layer 331, a second ML stack layer 332, a third ML stack layer 333, and the outer capping layer (OCL) 340.

The ICL 320 and the ML stack layers form two pairs (N=2). Let $R_1$ and $R_2$ be the reflectivities (in percentage) at the first and second uses, respectively. Let $h_i$, $h_1$, $h_2$, $h_3$, and $h_o$ be the thickness (in nm) and $m_i$, $m_1$, $m_2$, $m_3$, and $m_o$ be the material of the ICL 320, the first ML stack layer 331, the second ML stack layer 332, the third ML stack layer 333, and the outer capping layer (OCL) 340, respectively. Table 1 shows $R_1$ and $R_2$ and the corresponding thickness and materials.

TABLE 1

| Case | $h_i$ $m_i$ | $h_1$ $m_1$ | $h_2$ $m_2$ | $h_3$ $m_3$ | $h_0$ $m_0$ | $R_1$ | $R_2$ |
|---|---|---|---|---|---|---|---|
| 1 | 2 Ru | 4.8 Si | 2.76 Mo | 4.14 Si | 2 Ru | 74.87 | 75.13 |
| 2 | 3 Ru | 3.65 Si | 2.76 Mo | 3.85 Si | 3 Ru | 73.20 | 73.56 |
| 3 | 5.94 Si | 2.76 Mo | 4.14 Si | 2.76 Mo | 10 Si | 71.39 | 72.42 |

As shown in Table 1, the differences in reflectivity between the first and second uses are 0.34%, 0.48%, 1.4% for cases 1, 2, and 3, respectively. This indicates that the reflectivity of the mask blank at the first use is almost the same as at the second use.

Figure 4B:
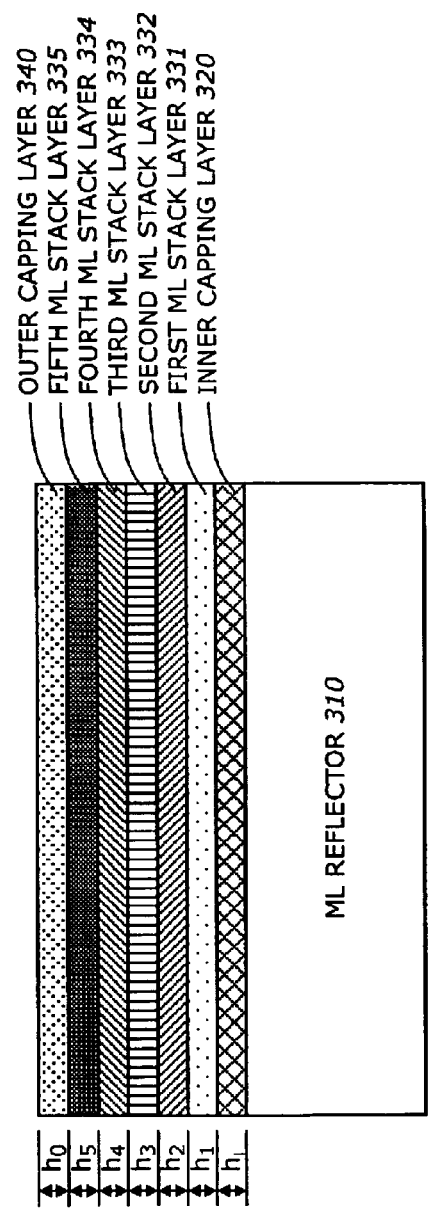
FIG. 4B is a diagram illustrating a reusable coating having five alternating layers in the ML stack according to one embodiment of the invention.

FIG. 4B is a diagram illustrating a re-usable coating 402 having five alternating layers in the ML stack according to one embodiment of the invention. The re-usable coating 402 has 5 ML stack layers in addition to the ICL 320 and the OCL 340. The five ML stack layers are first, second, third, fourth, and fifth ML stack layers 331, 332, 333, 334, and 335, respectively.

The ICL 320 and the ML stack layers form three pairs (N=3). Table 2 shows $R_1$ and $R_2$ and the corresponding thickness and materials. The notations are the same as those in Table 1 with the addition of $h_4$, $h_5$, $m_4$, and $m_5$ as the thickness and materials of the fourth and fifth ML stack layers 334 and 335, respectively.

TABLE 2

| Case | $h_1\ m_1$ | $h_1\ m_1$ | $h_2\ m_2$ | $h_3\ m_3$ | $h_4\ m_4$ | $h_5\ m_5$ | $h_0\ m_0$ | $R_1$ | $R_2$ |
|---|---|---|---|---|---|---|---|---|---|
| 1 | 2 Ru | 4.8 Si | 2.76 Mo | 4.14 Si | 2.76 Mo | 4.14 Si | 2 Ru | 75.00 | 75.13 |
| 2 | 3 Ru | 3.65 Si | 2.76 Mo | 3.85 Si | 2.76 Mo | 3.85 Si | 3 Ru | 73.37 | 73.56 |
| 3 | 5.94 Si | 2.76 Mo | 4.14 Si | 2.76 Mo | 4.14 Si | 2.76 Mo | 10 Si | 71.63 | 72.42 |

As shown in Table 2, the differences in reflectivity between the first and second cases are 0.17%, 0.25%, and 1.09% for cases 1, 2, and 3, respectively. These numbers show that the first use is almost the same as the second use.

Figure 4C:
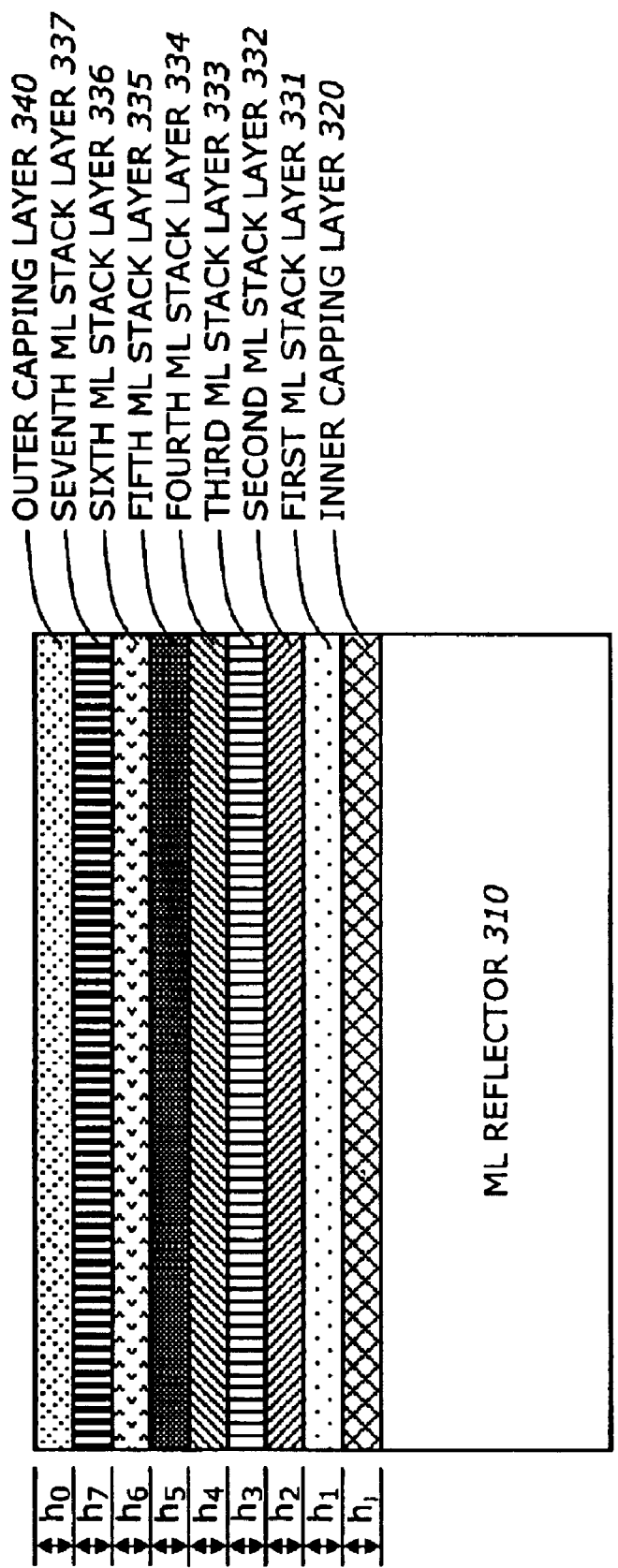
FIG. 4C is a diagram illustrating a reusable coating having seven alternating layers in the ML stack according to one embodiment of the invention.

FIG. 4C is a diagram illustrating a re-usable coating 403 having seven alternating layers in the ML stack according to one embodiment of the invention. The re-usable coating 403 has 7 ML stack layers in addition to the ICL 320 and the OCL 340. The seven ML stack layers are first, second, third, fourth, fifth, sixth, and seventh ML stack layers 331, 332, 333, 334, 335, 336 and 337, respectively.

The ILC 320 and the ML stack layers form 4 pairs (N=4). Table 3 shows $R_1$ and $R_2$ and the corresponding thickness and materials. The notations are the same as those in Table 2 with the addition of $h_6$, $h_7$, $m_6$, and $m_7$ as the thickness and materials of the sixth and seventh ML stack layers 336 and 337, respectively.

TABLE 3

| Case | $h_I\ m_i$ | $H_1\ m_1$ | $h_2\ m_2$ | $h_3\ m_3$ | $H_4 m_4$ | $h_5\ m_5$ | $h_6\ m_6$ | $h_7\ m_7$ | $H_0\ M_0$ | $R_1$ | $R_2$ |
|---|---|---|---|---|---|---|---|---|---|---|---|
| 1 | 2 Ru | 4.8 Si | 2.76 Mo | 4.14 Si | 2.76 Mo | 4.14 Si | 2.76 Mo | 4.14 Si | 2 Ru | 75.11 | 75.13 |
| 2 | 3 Ru | 3.65 Si | 2.76 Mo | 3.85 Si | 2.76 Mo | 4.14 Si | 2.46 Mo | 3.85 Si | 3 Ru | 73.54 | 73.56 |
| 3 | 5.94 Si | 2.76 Mo | 4.14 Si | 2.76 Mo | 4.14 Si | 2.76 Mo | 4.14 Si | 2.76 Mo | 10 Si | 71.84 | 72.42 |

As shown in Table 3, the differences in reflectivity between the first and second uses are 0.02%, 0.02%, and 0.8% for cases 1, 2, and 3, respectively. These numbers show that the first use is almost the same as the second use.

Table 4 shows a set of re-useable ML design with two, three, four, and five different layers of ML stacks and a triple ICL. The triple ICL consists of three layers: 2 nm Ru, 11.5 nm Si, and 2 nm Ru. During the blank reclaiming and mask patterning for the second use, if the top inner Ru capping layer is punched through, the underneath Si layer can continue protect the ML reflector. If the Si layer is further punched through, the underneath Ru layer can continue protect the ML reflector. In both cases, there is very little reflectivity impact to the reclaimed ML blank. When there is no punch through on the top inner Ru layer, it is possible that this re-useable ML blank design can be used the third time when the top inner Ru capping for the second use and Si layer underneath it are removed away, leaving the other Ru layer as the capping layer for the third use.

TABLE 4

| Case | Triple ICL ($h_i m_i$) | | | $h_1\ m_1$ | $h_2\ m_2$ | $h_3\ m_3$ | $h_4\ m_4$ | $h_5 m_5$ | $h_0\ m_0$ | $R_1$ | $R_2$ |
|---|---|---|---|---|---|---|---|---|---|---|---|
| 1 | 2 Ru | 11.5 Si | 2 Ru | 4.8 Si | 2.76 Mo | 11 Si | | | | 70.53 | 71.95 |
| 2 | 2 Ru | 11.5 Si | 2 Ru | 4.8 Si | 2.76 Mo | 4.14 Si | 2 Ru | | | 73.44 | 73.24 |
| 3 | 2 Ru | 11.5 Si | 2 Ru | 4.8 Si | 2.76 Mo | 4.14 Si | 2.76 Mo | 11 Si | | 70.88 | 71.95 |
| 4 | 2 Ru | 11.5 Si | 2 Ru | 4.8 Si | 2.76 Mo | 4.14 Si | 2.76 Mo | 4.14 Si | 2 Ru | 73.76 | 73.24 |

Note that in Table 4, the outer capping layer 340 is 11 nm Si, 2 nm Ru, 11 nm Si, 2 nm Ru for cases 1, 2, 3, and 4, respectively.

Figure 5:
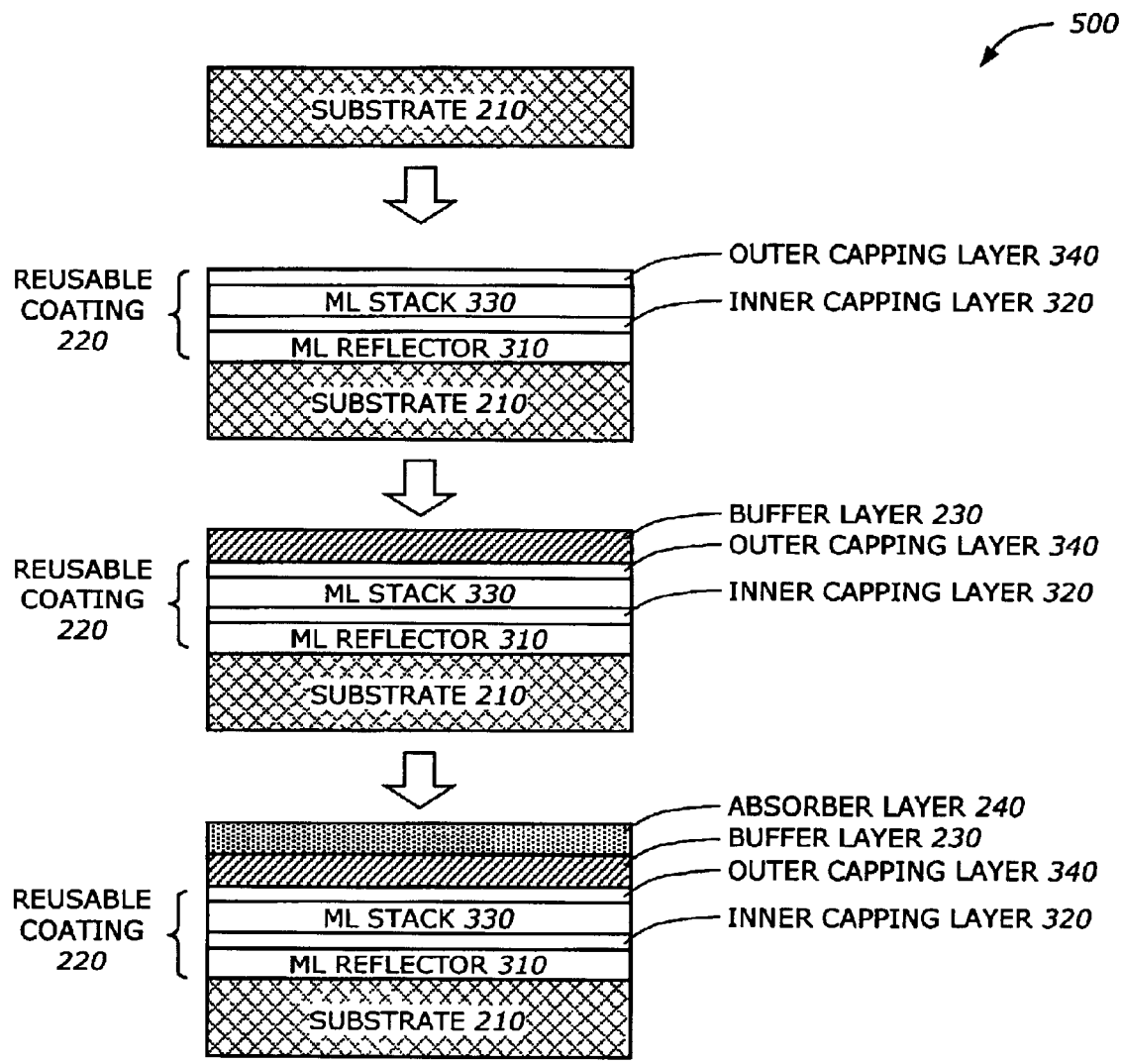
FIG. 5 is a diagram illustrating a process to fabricate a reusable mask blank according to one embodiment of the invention.

FIG. 5 is a diagram illustrating a process 500 to fabricate a reusable mask blank according to one embodiment of the invention.

The process 500 starts with formation and qualification of the substrate 210. Next, the re-usable coating 220 is deposited. Defect inspection is carefully performed to ensure high quality reflection. The re-usable coating 220 is deposited by depositing the pairs of layers of the ML reflector 310, the inner capping layer 320, the ML stack layers of the ML stack 330, and optionally the outer capping layer 340, in that order.

Next, the process 500 deposits the buffer layer 230. Then, the process 500 deposits the absorber layer 240. At this time, the complete re-usable mask blank is ready for the first use.

Figure 6:
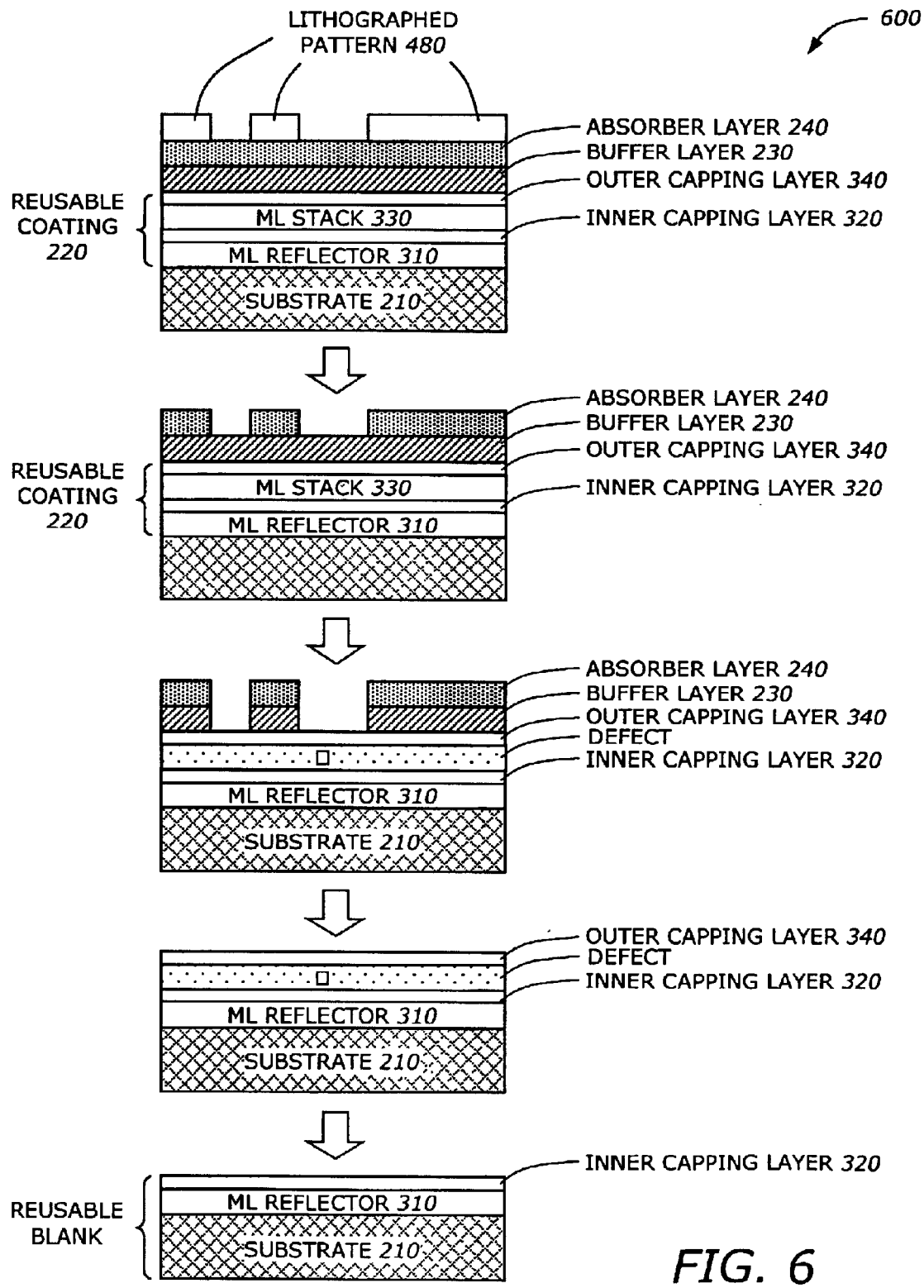
FIG. 6 is a diagram illustrating a process to reuse the mask blank according to one embodiment of the invention.

FIG. 6 is a diagram illustrating a process 600 to reuse the mask blank according to one embodiment of the invention.

The process 600 starts by creating a lithographic pattern 480. Next, this lithographic pattern is transferred to the absorber layer 240. The absorber layer 240 is etched according to the pattern. At this time, defect inspection and absorber repair are performed.

Then, the buffer layer 230 is etched away according to the pattern. Additional inspection and repair are performed to ensure high quality reflection. The imaging process is then performed.

After the first use, defects may occur in the ML stack 330 and the capping layer 340. Then, the outer capping layer 340 and the ML stack 330 are etched away, leaving the inner capping layer 320, the ML reflector 310, and the substrate 210 intact. The inner capping layer 320, the ML reflector 310, and the substrate 210 form a new mask blank ready for the second use.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   an outer capping layer made of an outer material and having an outer thickness;
   a multilayer (ML) stack below the outer capping layer; and
   an inner capping layer made of at least an inner material and having an inner thickness and located between the ML stack and a ML reflector, the inner thickness being selected to enable constructive interference between the ML stack and the ML reflector.

2. The apparatus of claim 1 wherein the inner capping layer and the ML stack form N pairs, N being a positive integer and being selected according to a mask usage.

3. The apparatus of claim 2 wherein N is between one and four.

4. The apparatus of claim 1 wherein at least one of the outer and inner materials has a refractive index highly different than an adjacent refractive index of an adjacent layer.

5. The apparatus of claim 1 wherein at least one of the outer and inner materials is one of gold (Au), baron nitride (BN), carbon (C), palladium (Pd), platinum (Pt), rhodium (Rh), ruthenium (Ru), silicon (Si), silicon carbide (SiC), baron carbide ($B_4C$), silicon oxide ($SiO_2$), and titanium nitride (TiN).

6. The apparatus of claim 1 wherein at least one of the outer and inner thickness is between 2 nanometer (nm) to 11 nm.

7. The apparatus of claim 1 wherein the ML stack forms a constructive interference of scattered radiation.

8. The apparatus of claim 1 wherein the ML stack comprises a layer having material made by one of gold (Au), baron (BN), carbon (C), palladium (Pd), platinum (Pt), rhodium (Rh), ruthenium (Ru), silicon (Si), molybdenum (Mo), silicon carbide (SiC), boron carbide ($B_4C$), silicon oxide ($SiO_2$), and titanium nitride (TiN).

9. The apparatus of claim 1 wherein the outer capping layer and the ML stack are etched away after a first use leaving the inner capping layer and the ML reflector for a second use.

10. The apparatus of claim 1 wherein the inner capping layer includes a plurality of inner layers.

11. A method comprising:
    depositing an inner capping layer on a multilayer (ML) reflector, the inner capping layer being made of at least an inner material and having an inner thickness;
    depositing a ML stack on the inner capping layer; and
    depositing an outer capping layer made of an outer material and having an outer thickness; wherein the inner thickness is selected to enable constructive interference between the ML stack and the ML reflector.

12. The method of claim 11 wherein depositing the ML stack comprises depositing the ML stack such that the ML stack and the inner capping layer forms N pairs, N being a positive integer and selected according to a mask usage.

13. The method of claim 12 depositing the ML stack further comprises selecting N between one and four.

14. The method of claim 11 wherein at least one of the outer and inner materials has a refractive index highly different than an adjacent refractive index of an adjacent layer.

15. The method of claim 11 wherein at least one of the outer and inner materials is one of gold (Au), baron nitride (BN), carbon (C), palladium (Pd), platinum (Pt), rhodium (Rh), ruthenium (Ru), silicon (Si), silicon carbide (SiC), boron carbide ($B_4C$), silicon oxide ($SiO_2$), and titanium nitride (TiN).

16. The method of claim 11 wherein at least one of the outer and inner thickness is between 2 nanometer (nm) to 11 nm.

17. The method of claim 11 wherein depositing the ML stack comprises depositing the ML stack to form a constructive interference of scattered radiation.

18. The method of claim 11 wherein depositing the ML stack comprises depositing a layer having material made by one of gold (Au), baron nitride (BN), carbon (C), palladium (Pd), platinum (Pt), rhodium (Rh), ruthenium (Ru), silicon (Si), silicon carbide (SiC), molybdenum (Mo), boron carbide ($B_4C$), silicon oxide ($SiO_2$), and titanium nitride (TiN).

19. The method of claim 11 further comprising etching away the outer capping layer and the ML stack after a first use to leave the inner capping layer and the ML reflector for a second use.

20. The method of claim 11 wherein depositing the inner capping layer comprises depositing a plurality of inner layers.

21. A mask blank comprising:
    a substrate made of a low thermal expansion material;
    a multilayer (ML) reflector on the substrate; and
    a re-usable coating on the substrate, the re-usable coating comprising:
      an outer capping layer made of an outer material and having an outer thickness;
      a ML stack below the outer capping layer, and
      an inner capping layer made of at least an inner material and having an inner thickness and located between the ML stack and the ML reflector, the inner thickness being selected to enable constructive interference between the ML stack and the ML reflector.

22. The mask blank of claim 21 wherein the inner capping layer and the ML stack form N pairs, N being a positive integer and selected according to a mask usage.

23. The mask blank of claim 22 wherein N is between one and four.

24. The mask blank of claim 21 wherein at least one of the outer and inner materials has a refractive index highly different than an adjacent refractive index of an adjacent layer.

25. The mask blank of claim 21 wherein at least one of the outer and inner materials is one of gold (Au), baron nitride (BN), carbon (C), palladium (Pd), platinum (Pt), rhodium (Rh), ruthenium (Ru), silicon (Si), silicon carbide (SiC), boron carbide ($B_4C$), silicon oxide ($SiO_2$), and titanium nitride (TiN).

26. The mask blank of claim 21 wherein at least one of the outer and inner thickness is between 2 nanometer (nm) to 11 nm.

27. The mask blank of claim 21 wherein the ML stack forms a constructive interference of scattered radiation.

28. The mask blank of claim 21 wherein the ML stack comprises a layer having material made by one of gold (Au), baron nitride (BN), carbon (C), palladium (Pd), platinum (Pt), rhodium (Rh), ruthenium (Ru), silicon (Si), molybdenum (Mo), silicon carbide (SiC), boron carbide ($B_4C$), silicon oxide ($SiO_2$), and titanium nitride (TiN).

29. The mask blank of claim 21 wherein the outer capping layer and the ML stack are etched away after a first use leaving the inner capping layer and the ML reflector for a second use.

30. The mask blank of claim 21 wherein the inner capping layer includes a plurality of inner layers.

\* \* \* \* \*

UNITED STATES PATENT AND TRADEMARK OFFICE
CERTIFICATE OF CORRECTION

PATENT NO. : 6,756,163 B2
DATED : June 29, 2004
INVENTOR(S) : Yan

It is certified that error appears in the above-identified patent and that said Letters Patent is hereby corrected as shown below:

Column 3,
Line 31, delete "h," and insert -- $h_i$ --.
Line 49, delete "h," and insert -- $h_i$ --.

Signed and Sealed this

Seventh Day of December, 2004

JON W. DUDAS
*Director of the United States Patent and Trademark Office*